US012658391B2

(12) United States Patent
Jeon et al.

(10) Patent No.: US 12,658,391 B2
(45) Date of Patent: Jun. 16, 2026

(54) APPARATUS AND METHOD FOR MONITORING STATUS OF RELAY CIRCUIT

(71) Applicant: SAMSUNG SDI CO., LTD., Yongin-si (KR)

(72) Inventors: Peel Sik Jeon, Suwon-si (KR); In Beom Jeon, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 256 days.

(21) Appl. No.: 18/635,305

(22) Filed: Apr. 15, 2024

(65) Prior Publication Data

US 2025/0118514 A1      Apr. 10, 2025

(30) Foreign Application Priority Data

Oct. 6, 2023      (KR) ......................... 10-2023-0133094

(51) Int. Cl.
H01H 47/00      (2006.01)
G01R 31/327      (2006.01)
H01H 47/32      (2006.01)

(52) U.S. Cl.
CPC ....... H01H 47/002 (2013.01); G01R 31/3278 (2013.01); H01H 47/32 (2013.01)

(58) Field of Classification Search
CPC ...... H01H 47/00; H01H 47/002; H01H 47/32; H01H 50/44; H01H 50/443; G01R 31/3278; G01R 31/327; G01R 31/32; G01R 31/3275; G01R 15/18; G01R 19/165; G01R 19/16571; G01R 31/3274; G01R 31/396
See application file for complete search history.

(56) References Cited

U.S. PATENT DOCUMENTS

| | | |
|---|---|---|
| 2005/0270720 A1 | 12/2005 | Johnson, Jr. |
| 2012/0256598 A1* | 10/2012 | Hsu ........................... H04Q 9/00 |
| | | 320/148 |
| 2015/0109020 A1* | 4/2015 | Morino .................. G01R 31/52 |
| | | 324/764.01 |
| 2018/0259582 A1 | 9/2018 | Koch et al. |

FOREIGN PATENT DOCUMENTS

| | | | |
|---|---|---|---|
| EP | 3827453 B1 | 1/2023 | |
| KR | 10-2023-0067793 A | 5/2023 | |

OTHER PUBLICATIONS

European Search Report dated Nov. 15, 2024.

* cited by examiner

*Primary Examiner* — Son T Le
(74) *Attorney, Agent, or Firm* — Lee IP Law, P.C.

(57)      ABSTRACT

An apparatus for monitoring a status of a relay circuit includes relay circuits configured to apply driving power to battery management devices, a microcomputer configured to output relay control signals for turning on/off the relay circuits, and a current application/detection circuit configured to apply a current to each of the relay circuits that are turned on by the relay control signals output from the microcomputer, and to convert and detect a total current applied to the turned-on relay circuits to a voltage level, wherein the microcomputer compares a current detected through the current application/detection circuit while selectively turning on/off the relay circuits and a current calculated corresponding to the number of relay circuits to which relay-on signals have been output up to a current point, and determines an operation status of the relay circuits according to whether the currents are equal within a specified error range.

15 Claims, 4 Drawing Sheets

(a) Current_OUT (b) Relay_sig1

(c) Relay_sig2

(d) Relay_sig3

(e) Relay_sig4

APPARATUS AND METHOD FOR MONITORING STATUS OF RELAY CIRCUIT

CROSS-REFERENCE TO RELATED APPLICATION

This application claims priority to and the benefit of Korean Patent Application No. 10-2023-0133094, filed on Oct. 6, 2023, the disclosure of which is incorporated herein by reference in its entirety.

BACKGROUND

1. Field

Embodiments relate to an apparatus and method for monitoring a status of a relay circuit.

2. Description of the Related Art

In general, an energy storage system (ESS) controls an operation sequence of rack battery management systems (RBMSs) in a container BMS.

To this end, a microcomputer (or processor) of the container BMS supplies power of a specified voltage level (e.g., 24 V) to each of a plurality of RBMS through a relay circuit.

In this case, a plurality of relay circuits (e.g., Relay Circuit #1 to Relay Circuit #N) are implemented in parallel so as to correspond to the plurality of RBMSs.

For example, the plurality of relay circuits are implemented such that the power is supplied to a first RBMS through a first relay circuit to drive the first RBMS, the power is supplied to a second RBMS through a second relay circuit to drive the second RBMS, and the power is supplied to an Nth RBMS through an Nth relay circuit to drive the Nth RBMS.

Accordingly, the microcomputer (or processor) of the container BMS outputs relay control signals Relay_sig1 to Relay_sigN (e.g., relay on signals or relay-off signals) to the relay circuits (e.g., Relay Circuit #1 to Relay Circuit #N) corresponding to the RBMSs to be driven, and as the relay control signals Relay_sig1 to Relay_sigN are applied, power of a specified voltage level (e.g., 24 V) is applied to coils of the corresponding relays, thereby driving the corresponding relays.

At this time, in the relay circuits (e.g., each of Relay Circuit #1 to Relay Circuit #N), the same level of voltage (e.g., 24 V) is applied to the coil of each relay.

Thus, it is necessary to check an operation status of each relay (i.e., whether the relay is failed or not) because the container BMS uses a plurality of relays.

To this end, conventionally, in order to check the operation status of each relay (or the relay circuit) (i.e., whether the relay is failed or not), a method of comparing a voltage level (e.g., 24 V) of power input to operate each relay and a voltage level of output power and determining that a failure has occurred if the voltage level of the input power and the voltage level of the output power are different was used.

Accordingly, in order to check the operation statuses of the plurality of relays (or relay circuits) by using the conventional method, the number of ports (or terminals) corresponding to the number of relays must be provided in the microcomputer (or processor), which complicates a circuit configuration and increases costs.

The above information disclosed in this Background section is for enhancement of understanding of the background of the present disclosure.

SUMMARY

Embodiments include an apparatus for monitoring a status of a relay circuit. The apparatus includes a plurality of relay circuits configured to apply driving power to a plurality of battery management devices, a microcomputer configured to output relay control signals for turning on/off the plurality of relay circuits, and a current application/detection circuit configured to apply a current to each of the plurality of relay circuits that are turned on by the output relay control signals from the microcomputer, and to detect and convert a total current applied to the plurality of relay circuits turned on, to a voltage level, wherein the microcomputer makes a comparison between a current detected through the current application/detection circuit while selectively turning on/off the plurality of relay circuits and a current calculated corresponding to a number of relay circuits of the plurality of relay circuits to which relay-on signals have been output up to a current point, and determines an operation status of the plurality of relay circuits according to whether the current detected and the current calculated are equal to each other within a specified error range.

The plurality of relay circuits may be implemented as circuits of a same type, may be connected in parallel, and may each be applied with driving power of a same voltage level.

Each of the plurality of relay circuits may include a switching element switched by a relay control signal and a relay switched by applying power to a relay coil in response to switching of the switching element.

The switching element insulates a port of the microcomputer from the relay, and includes a photo coupler.

The plurality of battery management devices may include a rack battery management system.

The current application/detection circuit may include a current detection resistor for detecting a current applied to each relay coil from a power source and a comparator configured to detect and output a voltage across both ends of the current detection resistor.

The current application/detection circuit may detect a voltage proportional to a current flowing through the current detection resistor and may output the voltage to the microcomputer as a current proportional to a number of relay circuits currently turned on and driven flows through the current detection resistor.

If the microcomputer outputs the relay control signals to the plurality of relay circuits in order to compare the current detected and the current calculated, the microcomputer calculates a voltage level converted from the current flowing corresponding to the number of relay circuits, to which the relay control signals have been output up to the current point, detects the current flowing through the current application/detection circuit, and converts the current detected to a voltage level.

If the detected current and the calculated current are equal within the specified error range as a result of the comparison, the microcomputer determines that the relay circuit, which is currently receiving the relay control signal and driven, is normal.

If the detected current and the calculated current are not equal within the specified error range as a result of the comparison, the microcomputer determines that the relay circuit, which is currently receiving the relay control signal and driven, is abnormal.

Embodiments include a method of monitoring a status of a relay circuit. The method includes selectively turning on/off a plurality of relay circuits that apply driving power to a plurality of battery management device, by a microcomputer of an apparatus for monitoring the status of the relay circuit, comparing a current detected through a current application/detection circuit with a current calculated corresponding to a number of relay circuits to which relay-on signals have been output up to a current point, by the microcomputer, and determining, by the microcomputer, based on a result of the comparing, an operation status of the relay circuit, wherein the current application/detection circuit applies a current to each of the plurality of relay circuits that are turned on by the output relay control signals from the microcomputer, and detects and converts a total current applied to the relay circuits turned on, to a voltage level.

The current application/detection circuit may detect a voltage proportional to a current flowing through a current detection resistor and may output the voltage to the microcomputer as a current proportional to the number of relay circuits currently turned on and driven flows through the current detection resistor.

If the microcomputer outputs the relay control signals to the plurality of relay circuits in order to perform the comparing, the microcomputer may calculate a voltage level converted from the current flowing corresponding to the number of relay circuits, to which the relay control signals have been output up to the current point, may detect the current flowing through the current application/detection circuit, and may convert the current to a voltage level.

If the current detected and the current calculated are equal within a specified error range as a result of the comparing, the microcomputer determines that the relay circuit, which is currently receiving a relay control signal and is being driven, is normal.

If the current detected and the current calculated are not equal within a specified error range as a result of the comparing, the microcomputer determines that the relay circuit, which is currently receiving a relay control signal and is being driven, is abnormal.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
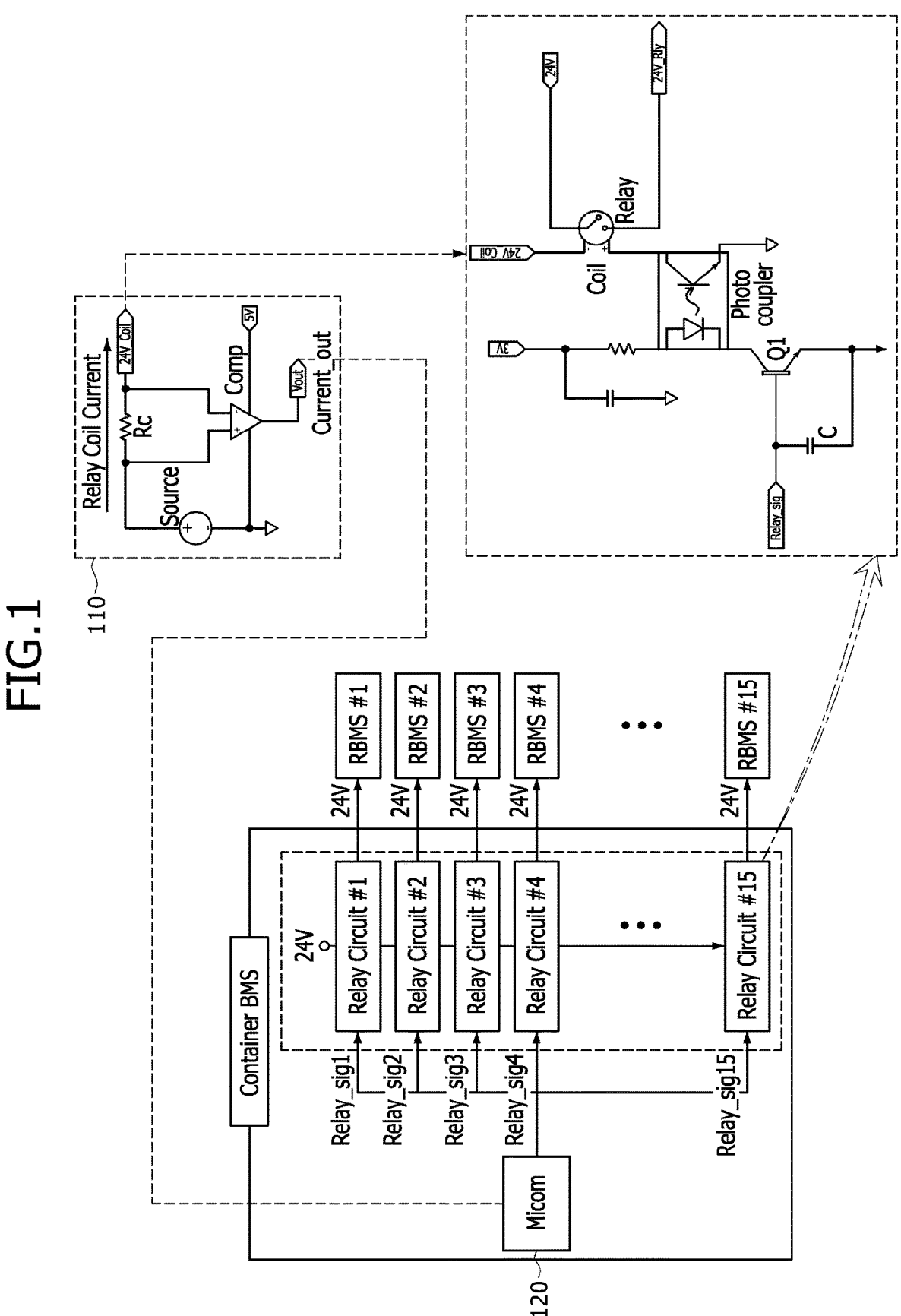
FIG. 1 is an exemplary diagram illustrating a schematic configuration of an apparatus for monitoring a status of a relay circuit according to one or more embodiments of the present disclosure.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that if a layer or element is referred to as being "on" another layer or substrate, it can be directly on the other layer or substrate, or intervening layers may also be present. Further, it will be understood that if a layer is referred to as being "under" another layer, it can be directly under, and one or more intervening layers may also be present. In addition, it will also be understood that if a layer is referred to as being "between" two layers, it can be the only layer between the two layers, or one or more intervening layers may also be present. Like reference numerals refer to like elements throughout.

Hereinafter, one or more embodiments according to the present disclosure will be described with reference to the accompanying drawings.

The terms described below are defined in consideration of functions of the present embodiments, which may vary depending on the intention of a user or operator, or custom. Thus, the definitions of the terms should be based on contents throughout this specification.

The embodiments described in this specification and the configurations shown in the drawings are only some of the embodiments of the present disclosure and do not represent all of the technical ideas, aspects, and features of the present disclosure. Accordingly, it should be understood that there may be various equivalents and modifications that can replace or modify the embodiments described herein at the time of filing this application.

It will be understood that if an element or layer is referred to as being "on," "connected to," or "coupled to" another element or layer, it may be directly on, connected, or coupled to the other element or layer or one or more intervening elements or layers may also be present. If an element or layer is referred to as being "directly on," "directly connected to," or "directly coupled to" another element or layer, there are no intervening elements or layers present. For example, if a first element is described as being "coupled" or "connected" to a second element, the first element may be directly coupled or connected to the second element or the first element may be indirectly coupled or connected to the second element via one or more intervening elements.

As used herein, the term "and/or" includes any and all combinations of one or more of the associated listed items. Further, the use of "may" if describing embodiments of the present disclosure relates to "one or more embodiments of the present disclosure." Expressions, such as "at least one of" and "any one of," if preceding a list of elements, modify the entire list of elements and do not modify the individual elements of the list. If phrases such as "at least one of A, B and C," "at least one of A, B or C," "at least one selected from a group of A, B and C," or "at least one selected from among A, B and C" are used to designate a list of elements A, B and C, the phrase may refer to any and all suitable combinations or a subset of A, B and C, such as A, B, C, A and B, A and C, B and C, or A and B and C. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," if used in this specification, specify the presence of stated features, integers, steps, operations, elements, and/or components but do not preclude the presence or addition of one or more other features, integers, steps, operations, elements, components, and/or groups thereof.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification.

References to two compared elements, features, etc. as being "the same" may mean that they are "substantially the same". Thus, the phrase "substantially the same" may include a case having a deviation that is considered low in the art, for example, a deviation of 5% or less. In addition, if a certain parameter is referred to as being uniform in a given region, it may mean that it is uniform in terms of an average.

Throughout the specification, unless otherwise stated, each element may be singular or plural.

If an arbitrary element is referred to as being disposed (or located or positioned) on the "above (or below)" or "on (or under)" a component, it may mean that the arbitrary element is placed in contact with the upper (or lower) surface of the component and may also mean that another component may be interposed between the component and any arbitrary element disposed (or located or positioned) on (or under) the component.

In addition, it will be understood that if an element is referred to as being "coupled," "linked" or "connected" to another element, the elements may be directly "coupled," "linked" or "connected" to each other, or an intervening element may be present therebetween, through which the element may be "coupled," "linked" or "connected" to another element. In addition, if a part is referred to as being "electrically coupled" to another part, the part can be directly connected to another part or an intervening part may be present therebetween such that the part and another part are indirectly connected to each other.

Throughout the specification, if "A and/or B" is stated, it means A, B or A and B, unless otherwise stated. That is, "and/or" includes any or all combinations of a plurality of items enumerated. If "C to D" is stated, it means C or more and D or less, unless otherwise specified.

An apparatus for monitoring a status of a relay circuit according to one or more embodiments can be implemented in a container battery management system (BMS).

FIG. 1 is an exemplary diagram illustrating a schematic configuration of an apparatus for monitoring a status of a relay circuit according to one or more embodiments of the present disclosure.

As shown in FIG. 1, the apparatus for monitoring a status of a relay circuit may include a plurality of relay circuits (e.g., Relay Circuit #1 to Relay Circuit #15) configured to apply driving power of a specified voltage level (e.g., 24 V) to each of a plurality of rack BMSs (RBMSs), a microcomputer (or processor) 120 configured to output relay control signals Relay_sig1 to Relay_sig15 (e.g., relay-on signals or relay-off signals) to the relay circuits (e.g., Relay Circuit #1 to Relay Circuit #15) corresponding to the respective RBMS in order to apply or block the driving power to the corresponding RBMS, and a current application/detection circuit 110 configured to apply a current to each of one or more relay circuits (e.g., Relay Circuit #1 to Relay Circuit #15) driven by the relay control signals (Relay_sig1 to Relay_sig15), and detect a level (i.e., a level of voltage converted from the current) of the total current applied to the one or more relay circuits.

In this case, the plurality of relay circuits (e.g., Relay Circuit #1 to Relay Circuit #15) may be connected in parallel and each may be applied with driving power of the same voltage level.

The plurality of relay circuits (e.g., Relay Circuit #1 to Relay Circuit #15) may be implemented as circuits of a same type.

For example, each of the relay circuits (e.g., Relay Circuit #1 to Relay Circuit #15) may include a switching element (e.g., a photo coupler) that is switched in response to one of the relay control signals (Relay_sig1 to Relay_sig15), and a relay that is switched by applying power to a relay coil in response to the switching of the switching element (e.g., a photo coupler). As a result, a port (or terminal) of the microcomputer (or processor) 120 and the relay may be insulated from each other through the switching element (e.g., a photo coupler).

The current application/detection circuit 110 may include a current detection resistor Rc for detecting a current applied to each relay coil from a power source (Source), and a comparator (Comp) that detects and outputs a voltage across both ends of the current detection resistor Rc.

For example, since the plurality of relay circuits (e.g., Relay Circuit #1 to Relay Circuit #15) are connected in parallel, the current applied to the plurality of relay circuits (e.g., Relay Circuit #1 to Relay Circuit #15) from the power source (Source) of the current application/detection circuit 110 constantly increases or decreases in proportion to the number of relay circuits currently being driven. Thus, as the current applied to the plurality of relay circuits from the power source (Source) increases or decreases, a level of the voltage across both ends of the current detection resistor RC detected through the comparator (Comp) also increases or decreases accordingly, for example, at a constant rate.

If the microcomputer (or processor) 120 outputs the relay control signals Relay_sig1 to Relay_sig15 (e.g., relay-on signals or relay-off signals) to the plurality of relay circuits (e.g., Relay Circuit #1 to Relay Circuit #15), the microcomputer (or processor) 120 may calculate a current output level (i.e., a level of voltage converted from the current) corresponding to the number of relay circuits to which relay-on signals have been output up to a current point (i.e., a current point in time), and also may detect a current output level (i.e., a level of voltage converted from the current) actually applied to the plurality of relay circuits through the current application/detection circuit 110.

Further, the microcomputer (or processor) 120 may compare the detected current output level (i.e., the level of voltage converted from the current) and the calculated current output level (i.e., the level of voltage converted from the current) to check whether the levels are equal to each other within a specified error range.

Further, the microcomputer (or processor) 120 may compare the detected current output level (i.e., the level of voltage converted from the current) and the calculated current output level (i.e., the level of voltage converted from the current), which may be referred to herein as the "current detected" and "current calculated," respectively, and may determine that the relay circuit (or relay), to which a relay control signal (e.g., a relay-on signal or a relay-off signal) is currently output, is normal if the currents are equal to each other within the specified error range.

Further, the microcomputer (or processor) 120 may compare the detected current output level (i.e., the level of voltage converted from the current) and the calculated current output level (i.e., the level of voltage converted from the current), and may determine that the relay circuit (or relay), to which the relay control signal (e.g., a relay-on signal or a relay-off signal) is currently output, is abnormal if the currents are not equal to each other within the specified error range.

Accordingly, the microcomputer (or processor) 120 may compare the detected current output level (i.e., the level of voltage converted from the current) and the calculated current output level (i.e., the level of voltage converted from the current), while turning on/off any of the relay circuits and may check whether the levels are equal to each other within the specified error range, so that operation statuses of the plurality of relay circuits can be rapidly monitored, and a circuit configuration for monitoring the operation statuses of the plurality of relay circuits connected in parallel can be simplified.

Figure 2:
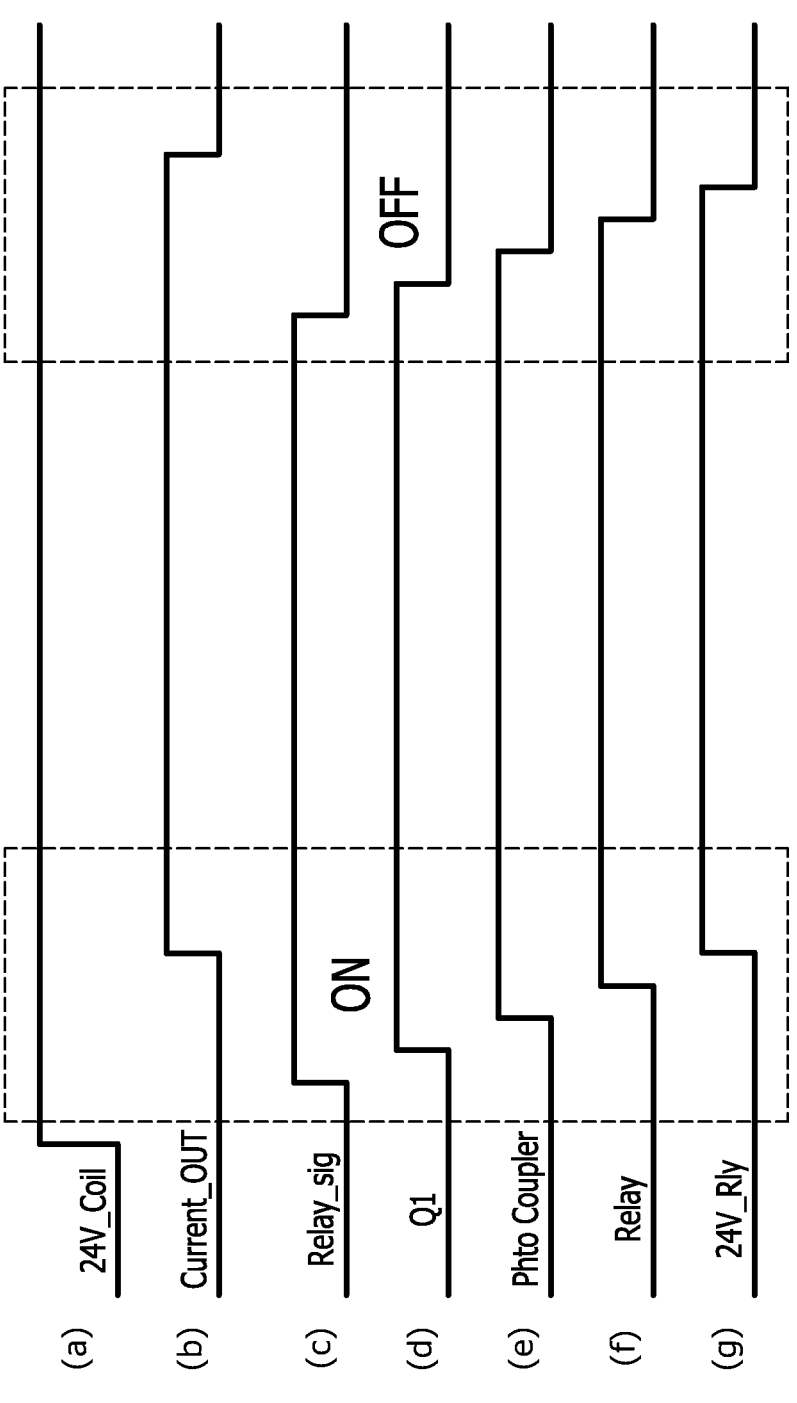
FIG. 2 is an exemplary diagram for describing a process of turning on/off the relay circuit by a microcomputer in FIG. 1 according to one or more embodiments of the present disclosure.

FIG. 2 is an exemplary diagram for describing a process of turning on/off the relay circuit by the microcomputer in FIG. 1 according to one or more embodiments of the present disclosure. However, it should be noted that FIG. 2 is somewhat exaggerated to facilitate understanding of the on/off operation of the relay circuit by the microcomputer.

Referring to FIG. 2, if the microcomputer (or processor) 120 applies power 24V_Coil of a specified voltage level to a relay coil through the current application/detection circuit 110 to turn on the relay circuit (see FIG. 2, line (a)), and applies the relay control signal (i.e., a relay-on signal) to the relay circuit to be driven (see FIG. 2, line (c)), a transistor Q1 connected to the photo coupler of the current application/detection circuit 110 may be turned on (see FIG. 2, line (d)), the photo coupler may be turned on (see FIG. 2, line (e)) as the transistor Q1 is turned on, the relay may be turned on (see FIG. 2, line (f)) as the photo coupler is turned on, and driving power 24V_Rly may be output as the relay is turned on.

Accordingly, the current output level (i.e., the level of voltage converted from the current) may be output through the current application/detection circuit 110 (see FIG. 2, line (b)).

Referring to FIG. 2 again, if the microcomputer (or processor) 120 applies the relay control signal (i.e., a relay-off signal) to the relay circuit to be turned off (see FIG. 2, line (c)) in the state, in which the power 24V_Coil of a specified voltage level is applied to the relay coil through the current application/detection circuit 110, to turn off the relay circuit (see FIG. 2, line (a)), the transistor Q1 connected to the photo coupler of the current application/detection circuit 110 may be turned off (see FIG. 2, line (d)), the photo coupler may be turned off (see FIG. 2, line (e)) as the transistor Q1 is turned off, the relay may be turned off (see FIG. 2, line (f)) as the photo coupler is turned off, and the outputting of the driving power 24V_Rly may be stopped as the relay is turned off.

Accordingly, the current output level (i.e., the level of voltage converted from the current) being output from the current application/detection circuit 110 (see FIG. 2, line (b)) is not output.

Figure 3:
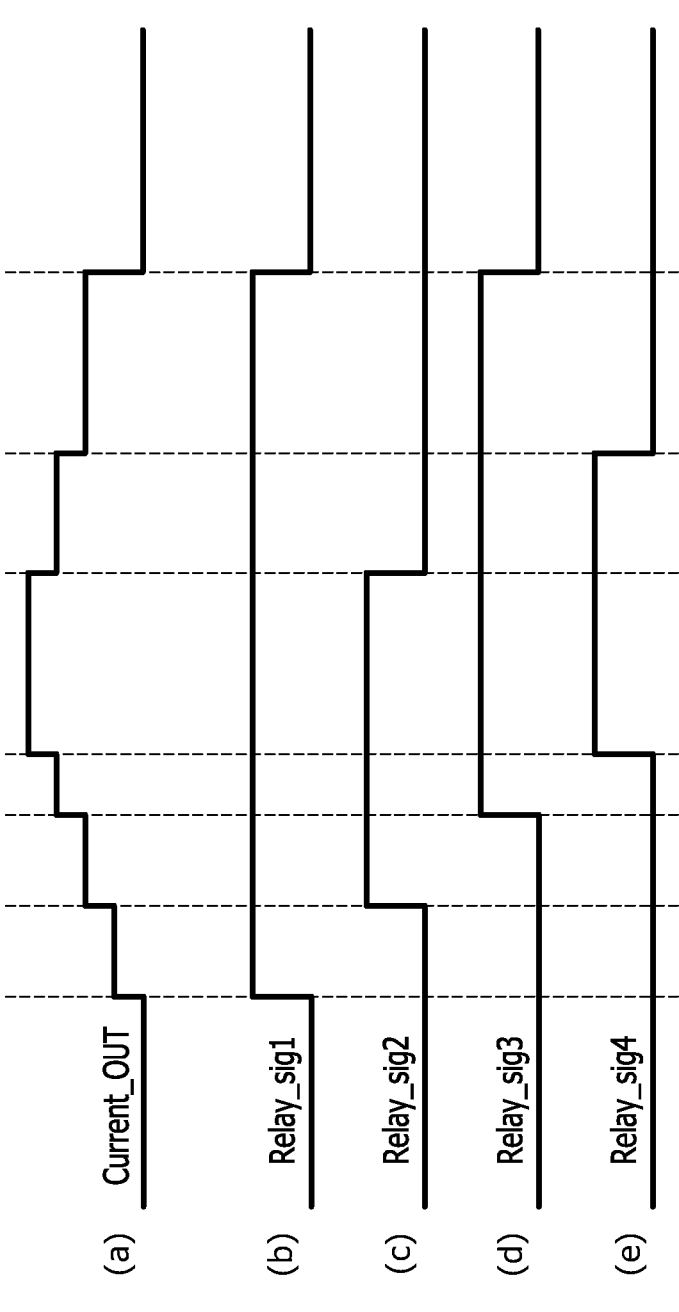
FIG. 3 is an exemplary diagram for describing an increase or decrease in a current output level output from a current application/detection circuit according to the turning on/off of the relay circuit in FIG. 1 according to one or more embodiments of the present disclosure.

FIG. 3 is an exemplary diagram for describing an increase or decrease in a current output level (i.e., the level of voltage converted from the current) output from the current application/detection circuit 110 according to the turning on/off of the relay circuit in FIG. 1 according to one or more embodiments of the present disclosure. However, it is noted that FIG. 3 is somewhat exaggerated to facilitate understanding of the operation in which the current output level increases or decreases depending on the on/off operation of the relay circuit.

Referring to FIG. 3, in the current application/detection circuit 110, the driving power 24V_Coil from the power source may initially be applied to the relay circuits, but if the relay control signals Relay_sig1 to Relay_sig15 are not output from the microcomputer 120 to the relay circuits (e.g., Relay Circuit #1 to Relay Circuit #15) to be driven, the voltage may not be detected at both ends of the current detection resistor Rc (in other words, the current output level (i.e., the level of voltage converted from the current) may not be output from the current application/detection circuit 110) because the power is not applied to the relay circuit (i.e., because no current flows through the relay circuit).

If the relay control signals (Relay_sig1 to Relay_sig15) are output from the microcomputer 120 to the relay circuits (e.g., Relay Circuit #1 to Relay Circuit #15) to be driven, the voltage across both ends of the current detection resistor Rc may be detected (in other words, the current output level (i.e., the level of voltage converted from the current) is output from the current application/detection circuit 110) because the power is applied to the relay circuit (i.e., because current flows through the relay circuit).

Since a current proportional to the number of relay circuits currently driven flows through the current detection resistor Rc of the current application/detection circuit 110, the current application/detection circuit 110 outputs a current output level (i.e., the level of voltage converted from the current) proportional to the number of relay circuits currently driven.

For example, if a first relay control signal Relay_sig1 (e.g., a relay-on signal) is output by the microcomputer 120 to turn on the first relay circuit (e.g., Relay Circuit #1) as shown in FIG. 3, line (b), a current output level Current_OUT (i.e., the level of voltage converted from the current) output by the current application/detection circuit 110 increases by a certain unit (i.e., by an amount corresponding to the current flowing as one relay circuit is turned on) as shown in FIG. 3, line (a). Similarly, as shown in FIG. 3, lines (c), (d) and (e) it can be seen that whenever the microcomputer 120 sequentially outputs second, third, and fourth relay control signals (e.g., Relay_sig2 to Relay_sig4) to turn on second, third, and fourth relay circuits (e.g., Relay Circuit #2 to Relay Circuit #4), the current output level Current_OUT (i.e., the level of voltage converted from the current) output from the current application/detection circuit 110 increases in sequence by the certain unit (i.e., by an amount corresponding to the current flowing as one relay circuit is turned on) as shown in FIG. 3, line (a).

If the second relay control signal Relay_sig2 (e.g., a relay-off signal) is output by the microcomputer 120 to turn off the second relay circuit (e.g., Relay Circuit #2) as shown in FIG. 3, line (c), the current output level Current_OUT (i.e., the level of voltage converted from the current) output by the current application/detection circuit 110 decreases by the certain unit (i.e., by an amount corresponding to the current flowing as one relay circuit is turned on) as shown in FIG. 3, line (a). Similarly, as shown in FIG. 3, lines (e), (b) and (d), it can be seen that whenever the microcomputer 120 sequentially outputs the fourth, first, and third relay control signals (e.g., Relay_sig4, Relay_sig1, and Relay_sig3) to turn off the fourth, first, and third relay circuits (e.g., Relay Circuit #4, Relay Circuit #1, and Relay Circuit #3), the current output level Current_OUT (i.e., the level of voltage converted from the current) output from the current application/detection circuit 110 decreases in sequence by the certain unit (i.e., by an amount corresponding to the current flowing as one relay circuit is turned on) as shown in FIG. 3, line (a).

Figure 4:
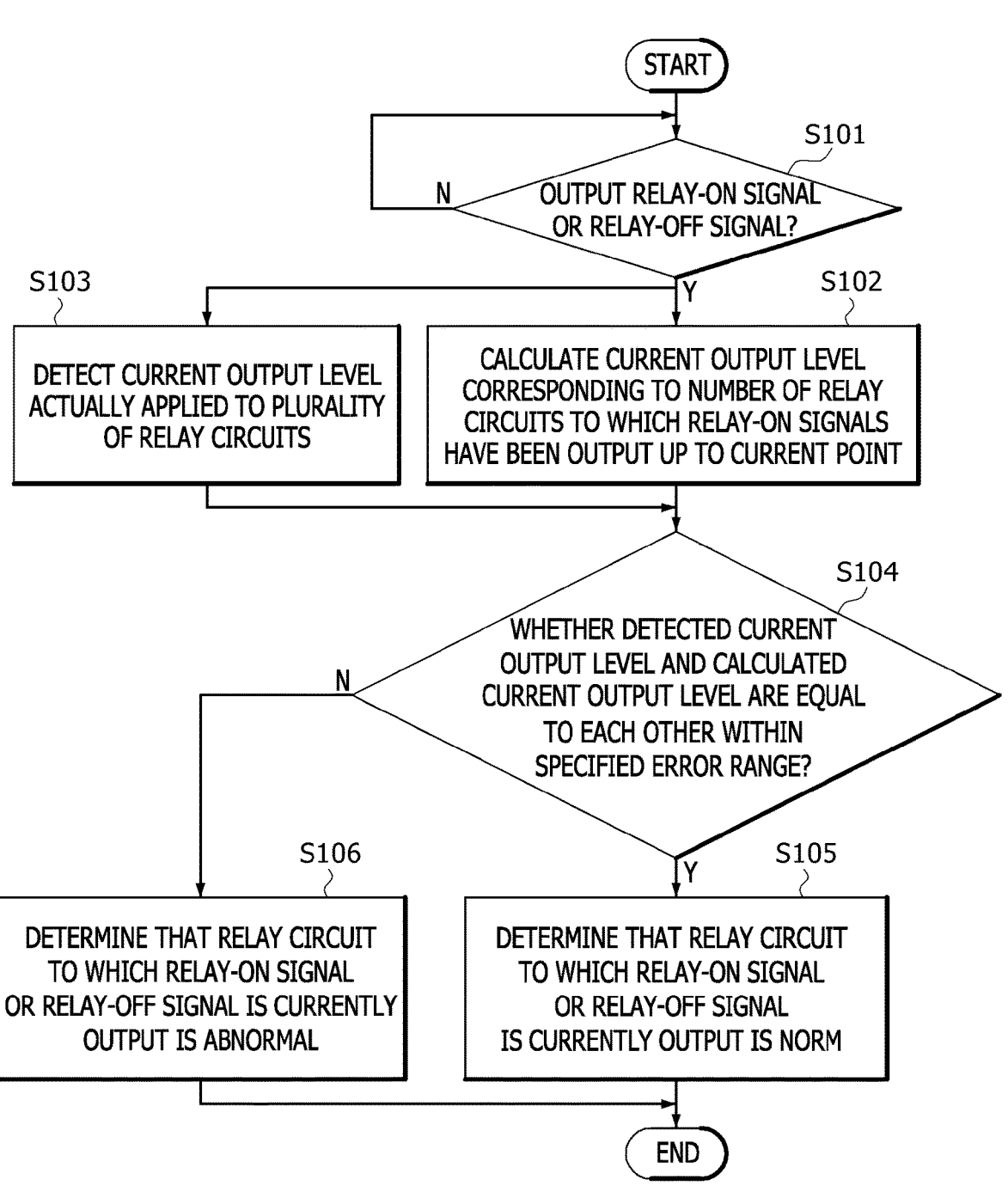
FIG. 4 is a flowchart for describing a method of monitoring a status of the relay circuit according to one or more embodiments of the present disclosure.

FIG. 4 is a flowchart for describing a method of monitoring a status of the relay circuit according to one or more embodiments of the present disclosure.

Referring to FIG. 4, if the microcomputer 120 outputs relay control signals Relay_sig1 to Relay_sig15 (e.g., relay-on signals or relay-off signals) to the plurality of relay circuits (e.g., Relay Circuit #1 to Relay Circuit #15) (YES in S101), the microcomputer 120 calculates (S102) a current output level (i.e., a level of voltage converted from the current) corresponding to the number of relay circuits to which the relay-on signals have been output up to a current point (i.e., a current point in time).

Further, a current output level (i.e., a level of voltage converted from the current) that is actually applied to the plurality of relay circuits may be detected (S103) through the current application/detection circuit 110. That is, the current output level (i.e., the level of voltage converted from the current) output from the current application/detection circuit 110 may be detected.

In addition, the microcomputer 120 may compare the current output level (i.e., the level of voltage converted from the current) detected through the current application/detection circuit 110 with the current output level (i.e., the level of voltage converted from the current) calculated corresponding to the number of relay circuits to which the relay-on signals have been output up to the current point, and may check (S104) whether the levels are equal within a specified error range.

Further, the microcomputer 120 may compare the current output level (i.e., the level of voltage converted from the current) detected through the current application/detection circuit 110 with the current output level (i.e., the level of voltage converted from the current) calculated corresponding to the number of relay circuits to which the relay-on signals have been output up to the current point, and may determine (S105) that the relay circuit to which the relay control signal (e.g., the relay-on signal or the relay-off signal) is currently output is normal if the currents are equal to each other within the specified error range (YES in S104).

Additionally, the microcomputer (or processor) 120 may compare the current output level (i.e., the level of voltage converted from the current) detected through the current application/detection circuit 110 with the current output level (i.e., the level of voltage converted from the current) calculated corresponding to the number of relay circuits to which the relay on signals have been output up to the current point, and may determine (S106) that the relay circuit to which the relay control signal (e.g., the relay-on signal or the relay-off signal) is currently output is abnormal if the currents are not equal within the specified error range (NO in S104).

At this time, the current output level (i.e., the level of voltage converted from the current) corresponding to the number of relay circuits may be calculated in advance and stored in a memory (not shown) in the form of a lookup table.

As described above, the microcomputer 120 may compare the current output level (i.e., the level of voltage converted from the current) detected through the current application/detection circuit 110 and the current output level (i.e., the level of voltage converted from the current) calculated corresponding to the number of relay circuits to which the relay-on signals have been output up to the current point while turning on/off any of the relay circuits and checks whether the levels are equal to each other within the specified error range, so that operation statuses of the plurality of relay circuits may be rapidly monitored, and a circuit configuration for monitoring the operation statuses of the plurality of relay circuits connected in parallel may be simplified.

The implementations described herein may be implemented in, for example, a method or a process, an apparatus, a software program, a data stream, or a signal. Even if only discussed in the context of a single form of implementation (for example, discussed only as a method), the implementation of features discussed may also be implemented in other forms (for example, an apparatus or program). The apparatus may be implemented as appropriate hardware, software, and firmware. The method may be implemented as an apparatus such as, a processor, which refers to a processing device in general, including, for example, a computer, a microprocessor, an integrated circuit, or a programmable logic device. The processor also includes communication devices, such as computers, cell phones, portable/personal digital assistants ("PDAs"), and other devices that facilitate communication of information between end-users.

The processor may be implemented as a central processing unit (CPU) or a system on chip (SoC), may operate an operating system or an application program to control a plurality of hardware or software components connected to the processor, and may perform various data processing and operations. The processor may be configured to execute at least one instruction stored in a memory (not shown) and store data resulting from the execution in the memory.

An apparatus and method for monitoring a status of a relay circuit according to the present disclosure enables operation statuses of a plurality of relay circuits connected in parallel to be rapidly monitored.

Further, an apparatus and method for monitoring a status of a relay circuit according to the present disclosure enables a circuit configuration for monitoring operation statuses of a plurality of relay circuits connected in parallel to be simplified.

Although the embodiments herein have been described with reference to the drawings, it will be understood that they are merely examples and various modifications and equivalents thereof may be made by one of ordinary skill in the art.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An apparatus for monitoring a status of a relay circuit, the apparatus comprising:

a plurality of relay circuits configured to apply driving power to a plurality of battery management devices;

a microcomputer configured to output relay control signals for turning on/off the plurality of relay circuits; and a current application/detection circuit configured to apply a current to each of the plurality of relay circuits that are turned on by the output relay control signals from the microcomputer, and to detect and convert a total current applied to the plurality of relay circuits turned on, to a voltage level, wherein the microcomputer makes a comparison between a current detected through the current application/detection circuit while selectively turning on/off the plurality of relay circuits and a current calculated corresponding to a number of relay circuits of the plurality of relay circuits to which relay-on signals have been output up to a current point, and determines an operation status of the plurality of relay circuits according to whether the current detected and the current calculated are equal to each other within a specified error range.

2. The apparatus as claimed in claim 1, wherein the plurality of relay circuits are implemented as circuits of a same type, are connected in parallel, and are each applied with driving power of a same voltage level.

3. The apparatus as claimed in claim 1, wherein each of the plurality of relay circuits includes:

a switching element switched by a relay control signal; and a relay switched by applying power to a relay coil in response to switching of the switching element.

4. The apparatus as claimed in claim 3, wherein the switching element insulates a port of the microcomputer from the relay, and includes a photo coupler.

5. The apparatus as claimed in claim 1, wherein the plurality of battery management devices include a rack battery management system.

6. The apparatus as claimed in claim 1, wherein the current application/detection circuit includes:

a current detection resistor for detecting a current applied to each relay coil from a power source; and a comparator configured to detect and output a voltage across both ends of the current detection resistor.

7. The apparatus as claimed in claim 6, wherein the current application/detection circuit detects a voltage proportional to a current flowing through the current detection resistor and outputs the voltage to the microcomputer as a current proportional to a number of relay circuits currently turned on and driven flows through the current detection resistor.

8. The apparatus as claimed in claim 1, wherein if the microcomputer outputs the relay control signals to the plurality of relay circuits in order to compare the current detected and the current calculated, the microcomputer calculates a voltage level converted from the current flowing corresponding to the number of relay circuits, to which the relay control signals have been output up to the current point, detects the current flowing through the current application/detection circuit, and converts the current detected to a voltage level.

9. The apparatus as claimed in claim 1, wherein if the current detected and the current calculated are equal within the specified error range as a result of the comparison, the microcomputer determines that the relay circuit, which is currently receiving the relay control signal and driven, is normal.

10. The apparatus as claimed in claim 1, wherein if the current detected and the current calculated are not equal within the specified error range as a result of the comparison, the microcomputer determines that the relay circuit, which is currently receiving the relay control signal and driven, is abnormal.

11. A method of monitoring a status of a relay circuit, the method comprising:

selectively turning on/off a plurality of relay circuits that apply driving power to a plurality of battery management device, by a microcomputer of an apparatus for monitoring the status of the relay circuit;

comparing a current detected through a current application/detection circuit with a current calculated corresponding to a number of relay circuits to which relay-on signals have been output up to a current point, by the microcomputer; and determining, by the microcomputer, based on a result of the comparing, an operation status of the relay circuit, wherein the current application/detection circuit applies a current to each of the plurality of relay circuits that are turned on by the output relay control signals output from the microcomputer, and detects and converts a total current applied to the relay circuits turned on, to a voltage level.

12. The method as claimed in claim 11, wherein the current application/detection circuit detects a voltage proportional to a current flowing through a current detection resistor and outputs the voltage to the microcomputer as the current proportional to the number of relay circuits currently turned on and driven flows through the current detection resistor.

13. The method as claimed in claim 11, wherein if the microcomputer outputs the relay control signals to the plurality of relay circuits in order to perform the comparing, the microcomputer calculates a voltage level converted from the current flowing corresponding to the number of relay circuits, to which the relay control signals have been output up to the current point, detects the current flowing through the current application/detection circuit, and converts the current to a voltage level.

14. The method as claimed in claim 11, wherein if the current detected and the current calculated are equal within a specified error range as a result of the comparing, the microcomputer determines that the relay circuit, which is currently receiving a relay control signal and is being driven, is normal.

15. The method as claimed in claim 11, wherein if the current detected and the current calculated are not equal within a specified error range as a result of the comparing, the microcomputer determines that the relay circuit, which is currently receiving a relay control signal and is being driven, is abnormal.

\* \* \* \* \*